United States Patent
Yun et al.

(10) Patent No.: US 8,415,204 B2
(45) Date of Patent: Apr. 9, 2013

(54) INTEGRATED CIRCUIT PACKAGING SYSTEM WITH HEAT SPREADER AND METHOD OF MANUFACTURE THEREOF

(75) Inventors: JaEun Yun, Ichon (KR); Jong Wook Ju, Icheon-Si (KR); WonJun Ko, Sungnam-Si (KR); Hye Ran Lee, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 179 days.

(21) Appl. No.: 12/412,315

(22) Filed: Mar. 26, 2009

(65) Prior Publication Data
US 2010/0244236 A1 Sep. 30, 2010

(51) Int. Cl.
*H01L 21/00* (2006.01)
(52) U.S. Cl. .......... 438/122; 257/713
(58) Field of Classification Search .......... 257/712–722; 438/122
See application file for complete search history.

(56) References Cited

U.S. PATENT DOCUMENTS

| | | | |
|---|---|---|---|
| 5,909,057 A * | 6/1999 | McCormick et al. | 257/704 |
| 6,188,578 B1 | 2/2001 | Lin et al. | |
| 6,294,831 B1 | 9/2001 | Shishido et al. | |
| 6,713,865 B2 | 3/2004 | Nomura | |
| 6,919,630 B2 | 7/2005 | Hsiao | |
| 7,169,650 B2 * | 1/2007 | Rinella et al. | 438/119 |
| 7,400,049 B2 | 7/2008 | Shim et al. | |
| 2003/0209801 A1 * | 11/2003 | Hua et al. | 257/707 |
| 2007/0040267 A1 * | 2/2007 | Zhao et al. | 257/706 |
| 2008/0293188 A1 * | 11/2008 | Hua et al. | 438/113 |
| 2009/0286382 A1 * | 11/2009 | Huff | 438/455 |

* cited by examiner

*Primary Examiner* — Shaun Campbell
(74) *Attorney, Agent, or Firm* — Ishimaru & Associates LLP

(57) ABSTRACT

A method of manufacture of an integrated circuit packaging system includes: providing a package substrate; mounting an integrated circuit die on the package substrate; and attaching a heat spreader assembly, having a thermal adhesive layer formed therein, to the package substrate and the integrated circuit die.

20 Claims, 3 Drawing Sheets

INTEGRATED CIRCUIT PACKAGING SYSTEM WITH HEAT SPREADER AND METHOD OF MANUFACTURE THEREOF

TECHNICAL FIELD

The present invention relates generally to an integrated circuit packaging system, and more particularly to a system for manufacturing a thermally efficient integrated circuit package.

BACKGROUND ART

The current trend in electronics is to make electronic devices with smaller components operating at higher clock frequencies and power levels generating more and more heat. These components include electronic packages such as microprocessor and memory packages. The electronic packages typically include a die that is usually mounted onto a supporting substrate sometimes referred to as a carrier or package substrate (PS). The electronic package, in turn, is typically physically and electrically coupled to a printed circuit board (PCB). The die and the substrate are typically made of multiple ceramic or silicon layers. The heat generated by such electronic packages may increase due to increased resistance under high temperature.

One common approach to draw the heat away from the die includes the use of a Heat Spreader (HS) in thermal contact with the die. This approach presents a manufacturing challenge to optimize a thermal-interface-design, for optimum heat transfer, while applying an adhesive material at the periphery of the HS for heat-spreader-attachment that will remain secure across a wide range of temperatures. To ensure thermal coupling between the HS and the die a Thermal Interface Material (TIM) is used.

The heat-spreader-attachment and the thermal-interface-design options are based, on performance considerations, in addition to cost effectiveness. These performance considerations include functional considerations such as thermal properties, and reliability considerations such as mechanical and environmental properties. In addition, the ease and cost of assembly and disassembly of the HS attachment structure are important.

A typical state of the art attachment of a HS to the backside of a high-power chip physically interconnects the HS structure to the system's substrate structure, namely the PCB. Such a design approach is used when there is a need to produce a high enough pressure at the thermal interface between the HS and the chip package. Such pressure is often needed for a satisfactory thermal performance of the interface.

Also known in the art are attachments of an HS to the PS, rather than to the PCB. Designs of this type are not intended and, in many cases, are not even supposed to produce high pressure at the HS/chip interface. Such HS to chip package attachment designs in the current art are acceptable if a relatively low pressure, for example a pressure in the range of 5-20 psi, can ensure a satisfactory thermal management of the integrated circuit (IC) device.

Long term reliability may suffer with these HS to chip package attachment designs due to failure of the TIM between the package and the HS. The encapsulant of the chip package may act as a thermal resistance keeping much of the heat close to the IC.

Thus, a need still remains for an integrated circuit packaging system with heat spreader that can be efficiently manufactured and operated reliably for the useful life of the integrated circuit. In view of the trend toward higher integration in chip packages, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package substrate; mounting an integrated circuit die on the package substrate; and attaching a heat spreader assembly, having a thermal adhesive layer formed therein, to the package substrate and the integrated circuit die.

The present invention provides an integrated circuit packaging system, including: a package substrate; an integrated circuit die mounted on the package substrate; and a heat spreader assembly, with a thermal adhesive layer therein, attached to the package substrate and the integrated circuit die.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
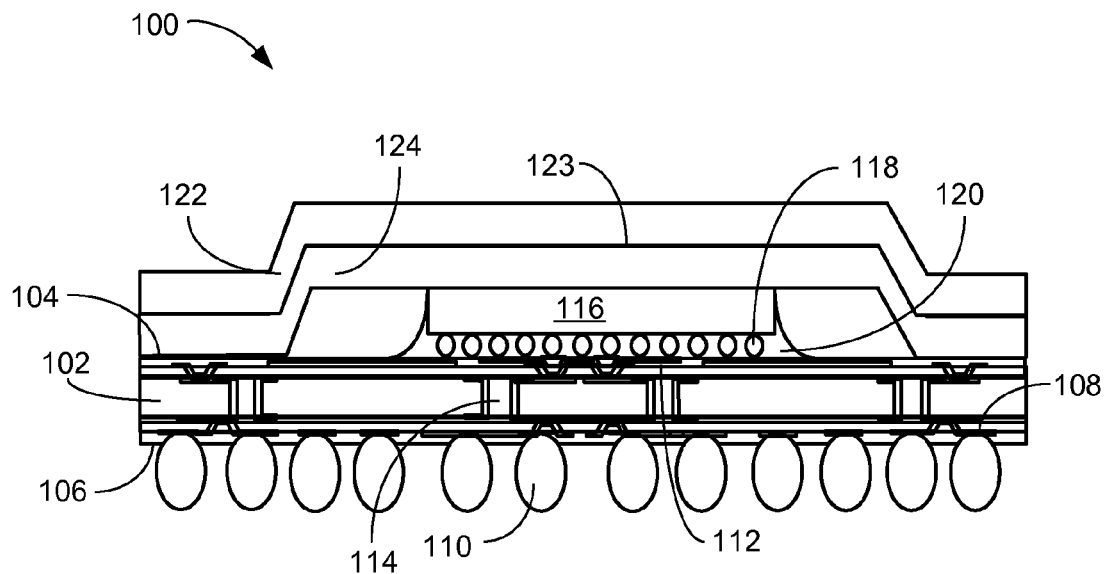
FIG. 1 is a cross-sectional view of an integrated circuit packaging system with heat spreader, as viewed along the section line 1-1 of FIG. 2, in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals.

For expository purposes, the term "horizontal" as used herein is defined as a plane parallel to the plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Figure 2:
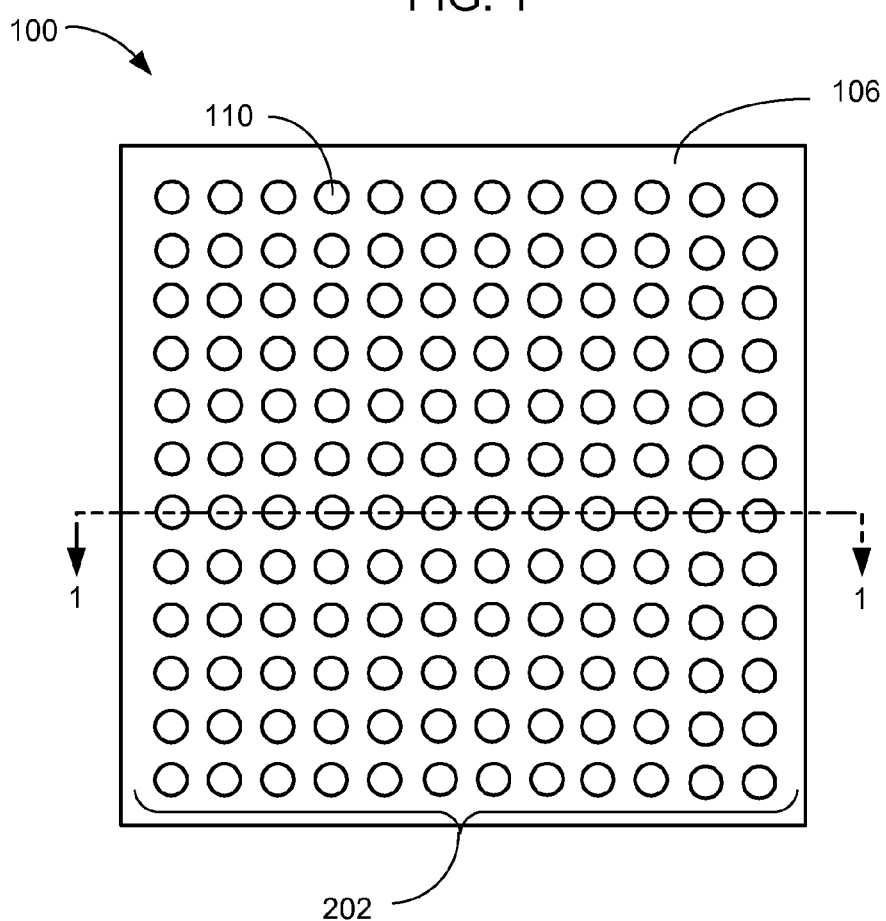
FIG. 2 is a bottom view of the integrated circuit packaging system, of FIG. 1.

Referring now to FIG. 1, therein is shown a cross-sectional view of an integrated circuit packaging system 100 with heat spreader, as viewed along the section line 1-1 of FIG. 2, in an embodiment of the present invention. The cross-sectional view of the integrated circuit packaging system 100 depicts a package substrate 102, such as a laminate substrate or a ceramic substrate, having a component side 104 and a system side 106. System contacts 108 may be formed in the system side of the package substrate 102. System interconnects 110 may be coupled to the system contacts 108.

Component contacts 112 may be formed on the component side 104 of the package substrate 102. The component contacts 112 may be coupled to the system contacts 108 by vias 114. An integrated circuit die 116, having an active side and a back side, may be coupled to the component contacts 112 by chip interconnects 118. A sealant 120 may be applied around the chip interconnects 118 and forming a protective layer between the component side 104 and the active side of the integrated circuit die 116.

A heat spreader 122, having an entire inner area 123, may be formed of a metal or alloy for highly efficient transfer of heat. A thermal adhesive layer 124, such as a wire-in-film adhesive, may be applied to all of the entire inner area 123 of the heat spreader 122. The thermal adhesive layer 124 may be a thermally conductive dielectric material such as a B-stage material that has a low viscosity and as temperature increases, the viscosity gets lower. The thermal adhesive layer 124 may be cured to harden this thermally conductive dielectric material which can maintain a predetermined thickness.

When the heat spreader 122 is attached to the component side 104 of the package substrate 102, the thermal adhesive layer 124 may be in full contact with the back side surface of the integrated circuit die 116. Due to the low viscosity of the thermal adhesive layer 124, the back side of the integrated circuit die 116 is completely contacted by the thermal adhesive layer 124 allowing a highly efficient transfer of heat to the heat spreader 122. The thermal adhesive layer 124 can contact only the component side 104 of the package substrate 102 and only the back side of the integrated circuit die 116. The thermal adhesive layer 124 can extend from the component side 104 of the package substrate 102 to the back side of the integrated circuit die 116.

It has been discovered that the heat spreader 122 when attached by the thermal adhesive layer 124 may provide a radio frequency (RF) shield for the integrated circuit packaging system 100. An electrical connection may be formed between the system interconnects 110 and the heat spreader 122 through the via 114, the component contacts 112 and the thermal adhesive layer 124 to form the RF shield. It has also been discovered that the assembly process cycle time may be reduced by between 7% and 12% and provide a 4% decrease in cost relative to standard processing.

Referring now to FIG. 2, therein is shown a bottom view of the integrated circuit packaging system 100, of FIG. 1. The bottom view of the integrated circuit packaging system 100 depicts an array 202 of the system interconnects 110 on the system side 106. The section line 1-1 shows the position and direction of view for FIG. 1.

The number and position of the system interconnects 110 in the array 202 is an example only and the actual number and position may vary. The system side 106 may include a solder mask to facilitate better formation of the system interconnects 110.

Figure 3:
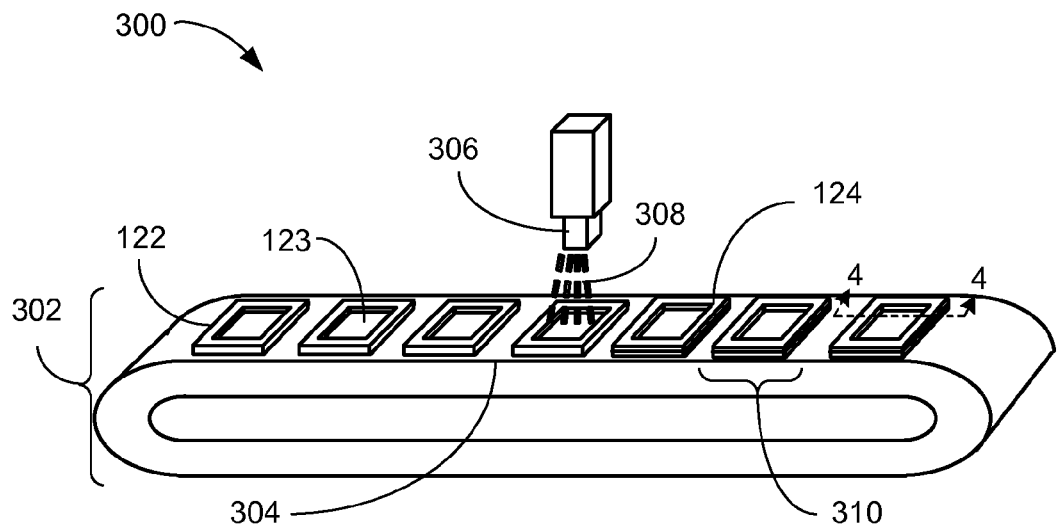
FIG. 3 is a perspective view of a heat spreader coating apparatus of the present invention.

Referring now to FIG. 3, therein is shown a perspective view of a heat spreader coating apparatus 300 of the present invention. The perspective view of the heat spreader coating apparatus 300 depicts a transport mechanism 302, such as a conveyer belt, providing a moveable platform 304. In the current example the direction of movement is from left to right.

As depicted, the heat spreader 122 is positioned on the moveable platform 304 with the entire inner area 123 facing upward. This may be done by an automated pick and place machine (not shown). The moveable platform 304 positions the heat spreader 122 under a spray nozzle 306. The spray nozzle 306 may apply a regulated amount of a thermally conductive liquid 308, such as the thermally conductive dielectric material. The application of the thermally conductive liquid 308 may form the thermal adhesive layer 124 on all of the entire inner area 123 of the heat spreader 122.

When the entire inner area 123 of the heat spreader 122 is completely coated with the thermally conductive liquid 308 it forms a heat spreader assembly 310. The moveable platform 304 may deliver the heat spreader assembly 310 to an automated collection mechanism (not shown), such as a collection chute. The section line 4-4 shows the position and direction of view of FIG. 4.

It is understood that the above process is an example only and other coating processes are possible. It is also understood that the thermally conductive liquid 308 may be a thermally conductive epoxy, a wire-in-film adhesive, or other thermally conductive adhesive.

Figure 4:
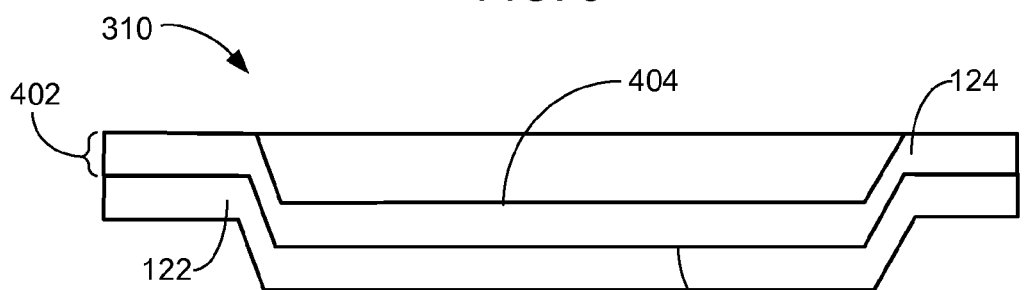
FIG. 4 is a cross-sectional view of the heat spreader assembly, as viewed along the section line 4-4 of FIG. 3.

Referring now to FIG. 4, therein is shown a cross-sectional view of the heat spreader assembly 310, as viewed along the section line 4-4 of FIG. 3. The cross-sectional view of the heat spreader assembly 310 depicts the heat spreader 122 having the thermal adhesive layer 124 applied thereon and completely covering the entire inner area 123. The thermal adhesive layer 124 may be applied to provide a pre-determined thickness 402 and providing an inner surface 404.

The pre-determined thickness 402 is known to be sufficient to guarantee a 100% interference fit with the integrated circuit die 116, of FIG. 1. The viscosity of the thermal adhesive layer 124 may allow the back side of the integrated circuit die 116 to deform the inner surface 404 to completely cover the back side.

Figure 5:
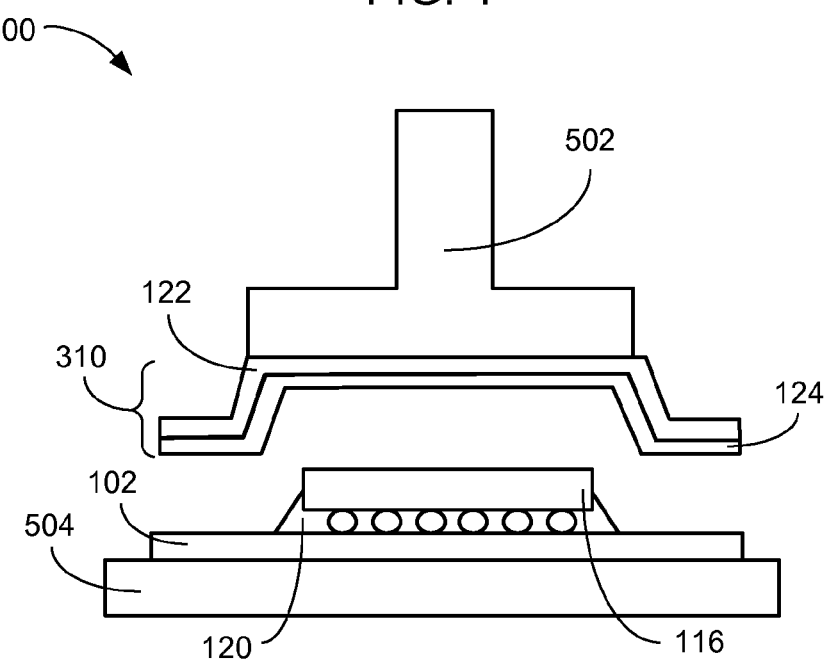
FIG. 5 is a cross-sectional view of a heat spreader attaching mechanism for implementing the integrated circuit packaging system, of the present invention.

Referring now to FIG. 5, therein is shown a cross-sectional view of a heat spreader attaching mechanism 500 for implementing the integrated circuit packaging system 100, of the present invention. The cross-sectional view of the heat spreader attaching mechanism 500 depicts a pick and place probe 502 having the heat spreader assembly 310 held by the heat spreader 122.

The thermal adhesive layer 124 may extend toward the package substrate 102 which may be mounted on a heat block 504. The heat block may elevate the temperature of the package substrate 102.

The pick and place probe 502 may be optically aligned with the package substrate 102 for placing the heat spreader 310. The elevated temperature of the package substrate 102 may increase the viscosity of the thermal adhesive layer 124 in order to secure the heat spreader assembly 310 to the package substrate and the back side of the integrated circuit die 116.

It has been discovered that the processing time to secure the heat spreader assembly 310 to the package substrate 102 and the back side of the integrated circuit die 116 is in the range of 1 to 2 seconds. It is known that the prior art heat spreader attach process may take in the range of 4 to 12 seconds to assure proper attachment of the heat spreader 122.

It has been unexpectedly discovered that, while decreasing the material cost per unit and increasing the through put by decreasing the processing time, the reliability of the integrated circuit die may be increased. The increase in reliability is the result of a more efficient thermal transfer provided by the present invention. It has been determined that the prior art thermal adhesive only contacted in the range of 40% to 65% of the back side of the integrated circuit die 116.

Figure 6:
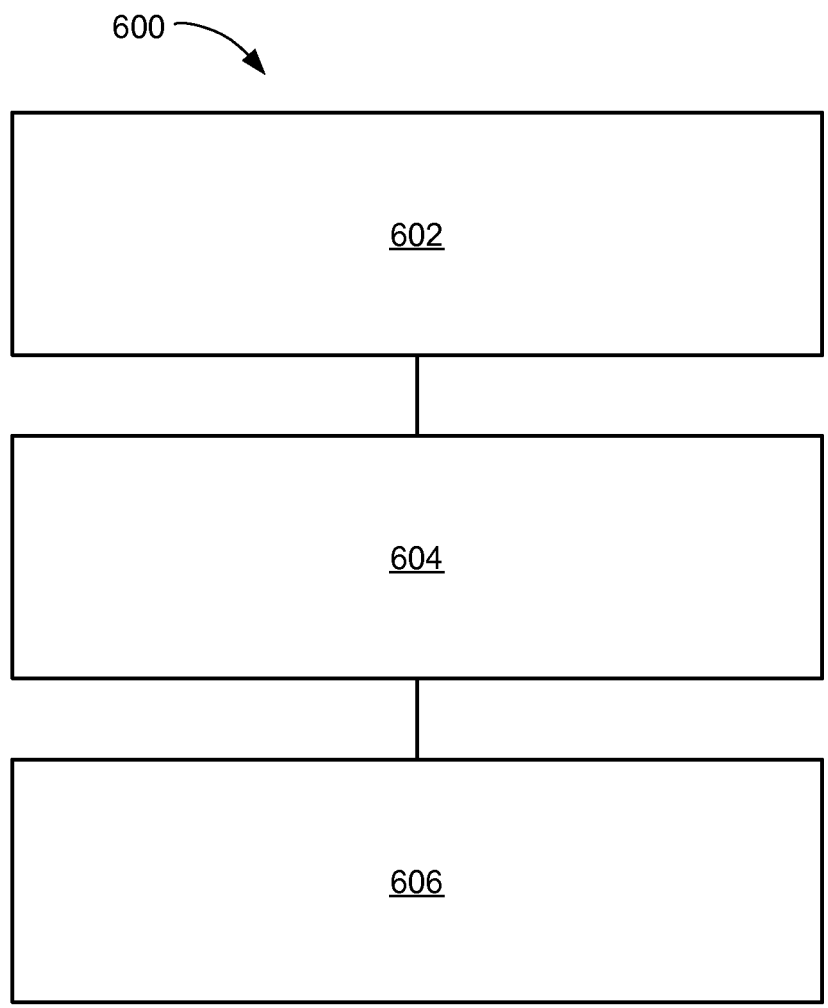
FIG. 6, is a flow chart of a method of manufacture of an integrated circuit packaging system in an embodiment of the present invention.

Referring now to FIG. 6, therein is shown a flow chart of a method 600 of manufacture of an integrated circuit packaging system in an embodiment of the present invention. The method 600 includes: providing a package substrate in a block 602; mounting an integrated circuit die on the package substrate in a block 604; and attaching a heat spreader assembly, having a thermal adhesive layer formed therein, to the package substrate and the integrated circuit die in a block 606.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit package systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
    providing a package substrate;
    mounting an integrated circuit die on the package substrate; and
    attaching a heat spreader assembly to the package substrate and the integrated circuit die, the heat spreader assembly having a thermal adhesive layer extending from the package substrate to a back side of the integrated circuit die and contacting only the package substrate and only the back side of the integrated circuit die.

2. The method as claimed in claim 1 wherein attaching the heat spreader assembly includes deforming an inner surface of the thermal adhesive layer by the integrated circuit die.

3. The method as claimed in claim 1 further comprising applying a sealant between the package substrate and the integrated circuit die.

4. The method as claimed in claim 1 wherein attaching the heat spreader assembly includes:
    providing a heat spreader;
    applying a thermally conductive liquid on an entire inner area of the heat spreader for forming the thermal adhesive layer; and
    pressing a pre-determined thickness of the thermal adhesive layer on the package substrate and the integrated circuit die.

5. The method as claimed in claim 1 wherein attaching the heat spreader assembly includes:
    providing a pick and place probe for positioning the heat spreader over the package substrate; and
    providing a heat block for elevating the temperature of the package substrate and the thermal adhesive layer while pressing the heat spreader assembly on the package substrate and the integrated circuit die.

6. A method of manufacture of an integrated circuit packaging system comprising:
    providing a package substrate having a component side and a system side;
    mounting an integrated circuit die on the component side of the package substrate; and
    attaching a heat spreader assembly to the component side of the package substrate and the integrated circuit die, the heat spreader assembly having a thermal adhesive layer extending from the package substrate to a back side of the integrated circuit die and contacting only the package substrate and only the back side of the integrated circuit die.

7. The method as claimed in claim 6 wherein attaching the heat spreader assembly includes deforming an inner surface of the thermal adhesive layer by the integrated circuit die including the back side of the integrated circuit die deforming the inner surface.

8. The method as claimed in claim 6 further comprising applying a sealant between the package substrate and the integrated circuit die including encasing a chip interconnect by the sealant.

9. The method as claimed in claim 6 wherein attaching the heat spreader assembly includes:
    providing a heat spreader including forming the heat spreader of a metal or an alloy;
    applying a thermally conductive liquid on an entire inner area of the heat spreader for forming the thermal adhesive layer including applying a thermally conductive dielectric material or a B-stage material; and
    pressing a pre-determined thickness of the thermal adhesive layer on the package substrate and the integrated circuit die including completely contacting the back side of the integrated circuit die.

10. The method as claimed in claim 6 wherein attaching the heat spreader assembly includes:

providing a pick and place probe for positioning the heat spreader over the package substrate including optically aligning the heat spreader assembly to the package substrate; and providing a heat block for elevating the temperature of the package substrate and the thermal adhesive layer while pressing the heat spreader assembly on the package substrate and the integrated circuit die including increasing the viscosity of the thermal adhesive layer on the integrated circuit die for 1 to 2 seconds.

11. An integrated circuit packaging system comprising:
a package substrate;
an integrated circuit die mounted on the package substrate; and
a heat spreader assembly attached to the package substrate and the integrated circuit die, the heat spreader assembly having a thermal adhesive layer extending from the package substrate to a back side of the integrated circuit die and contacting only the package substrate and only the back side of the integrated circuit die.

12. The system as claimed in claim 11 wherein the heat spreader assembly includes an inner surface of the thermal adhesive layer deformed by the integrated circuit die.

13. The system as claimed in claim 11 further comprising a sealant between the package substrate and the integrated circuit die.

14. The system as claimed in claim 11 wherein the heat spreader assembly includes:
a heat spreader;
a thermally conductive liquid applied on an entire inner area of the heat spreader for forming the thermal adhesive layer; and
a pre-determined thickness of the thermal adhesive layer on the package substrate and the integrated circuit die.

15. The system as claimed in claim 11 wherein the heat spreader assembly is a radio frequency shield attached to the package substrate.

16. The system as claimed in claim 11 wherein the package substrate includes:
a component side and a system side on the package substrate;
a component contact on the component side of the package substrate coupled to the integrated circuit die;
a system contact on the system side of the package substrate; and
a via coupled to the system contact and the component contact.

17. The system as claimed in claim 16 wherein the heat spreader assembly includes an inner surface of the thermal adhesive layer deformed by the integrated circuit die including the back side of the integrated circuit die on the inner surface.

18. The system as claimed in claim 16 further comprising:
a sealant between the package substrate and the integrated circuit die; and
a chip interconnect encased by the sealant.

19. The system as claimed in claim 16 wherein the heat spreader assembly includes:
a heat spreader includes a metal or an alloy to form the heat spreader;
a thermally conductive liquid on an entire inner area of the heat spreader forms the thermal adhesive layer includes a thermally conductive dielectric material or a B-stage material applied; and
a pre-determined thickness of the thermal adhesive layer pressed on the package substrate and the integrated circuit die includes the back side of the integrated circuit die completely contacted.

20. The system as claimed in claim 16 wherein:
the heat spreader assembly is a radio frequency shield attached to the package substrate; and
further comprising:
a system interconnect on the system contact electrically connected to the heat spreader through the thermal adhesive layer.

* * * * *